US006292121B1

(12) United States Patent
Cake et al.

(10) Patent No.: US 6,292,121 B1
(45) Date of Patent: Sep. 18, 2001

(54) DELTA SIGMA-ANALOG-TO-DIGITAL CONVERTER

(75) Inventors: Brian Cake, Sea Girt, NJ (US); Thomas Coutts Leslie, Kislingbury (GB)

(73) Assignees: LeCroy Corporation, Chestnut Ridge, NY (US); Phoenix VLSI Consultants, Northants (GB)

(*) Notice: Subject to any disclaimer, the term of this patent is extended or adjusted under 35 U.S.C. 154(b) by 0 days.

(21) Appl. No.: 09/351,250

(22) Filed: Jul. 7, 1999

Related U.S. Application Data

(63) Continuation of application No. PCT/US98/00311, filed on Jan. 9, 1998.

(51) Int. Cl.[7] .................................................. H03M 3/00
(52) U.S. Cl. .............................................. 341/143; 341/94
(58) Field of Search ..................................... 341/143, 163, 341/166, 182; 702/124; 327/553; 340/825

(56) References Cited

U.S. PATENT DOCUMENTS

| 4,888,587 | 12/1989 | Kuraishi . | |
|---|---|---|---|
| 5,030,954 | 7/1991 | Ribner . | |
| 5,055,843 | * 10/1991 | Ferguson et al. | 341/143 |
| 5,208,594 | 5/1993 | Yamazaki . | |
| 5,283,578 | * 2/1994 | Ribner et al. | 341/143 |
| 5,329,282 | 7/1994 | Jackson . | |
| 5,363,101 | 11/1994 | Ueki . | |
| 5,500,645 | * 3/1996 | Ribner et al. | 341/143 |
| 5,621,408 | 4/1997 | Cake et al. . | |
| 6,028,544 | * 2/2000 | Zarubinsky et al. | 341/143 |

OTHER PUBLICATIONS

Botteron et al, "An Investigation of Bandpass Sigma–Delta A/D Converters," Circuits and Systems, 293–296, Aug. 1997.*

Botteron et al, "An Investigation of Bandpass Sigma–Delta A/D Converters," Circuits and Systems, 293–296.*

* cited by examiner

*Primary Examiner*—Patrick Wamsley
(74) *Attorney, Agent, or Firm*—Frommer Lawrence & Haug, LLP; William S. Frommer; Gordon Kessler

(57) ABSTRACT

An analog to digital converter converts an analog input signal to at least two digital output signals as follows. An analog feedback signal is subtracted from the analog input signal to produce a difference signal. The difference signal, then, is integrated to produce an integrated signal which is quantized to produce the digital output signals in response to respective control signals each having a predetermined frequency and being offset in phase from each other. Finally, the digital output signals are converted into the analog feedback signal. Such analog to digital converter uses components operating at a lower frequency than the sampling frequency $f_s$ without loss of dynamic range.

18 Claims, 9 Drawing Sheets

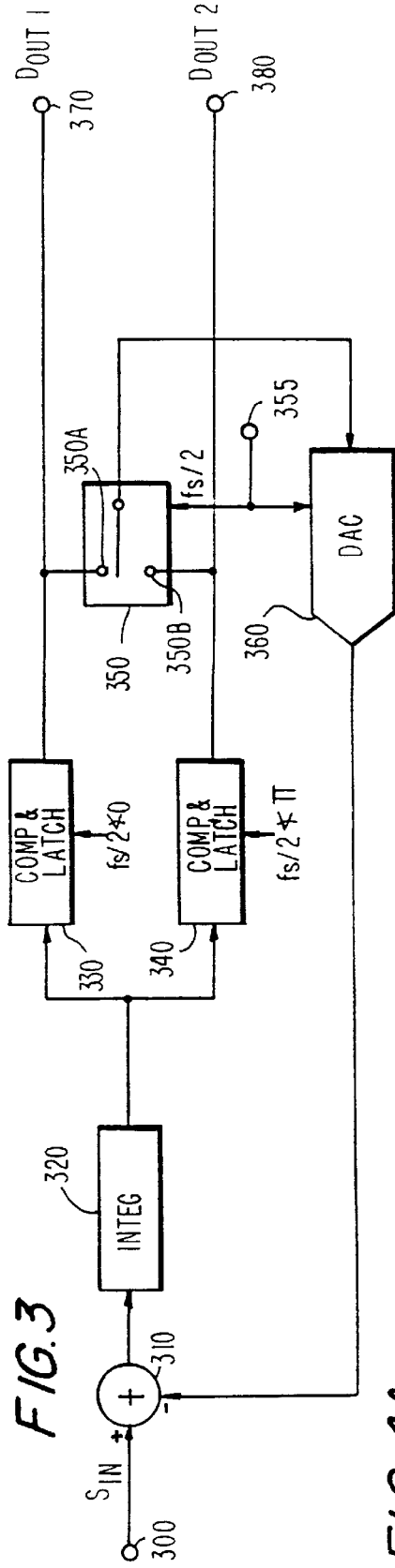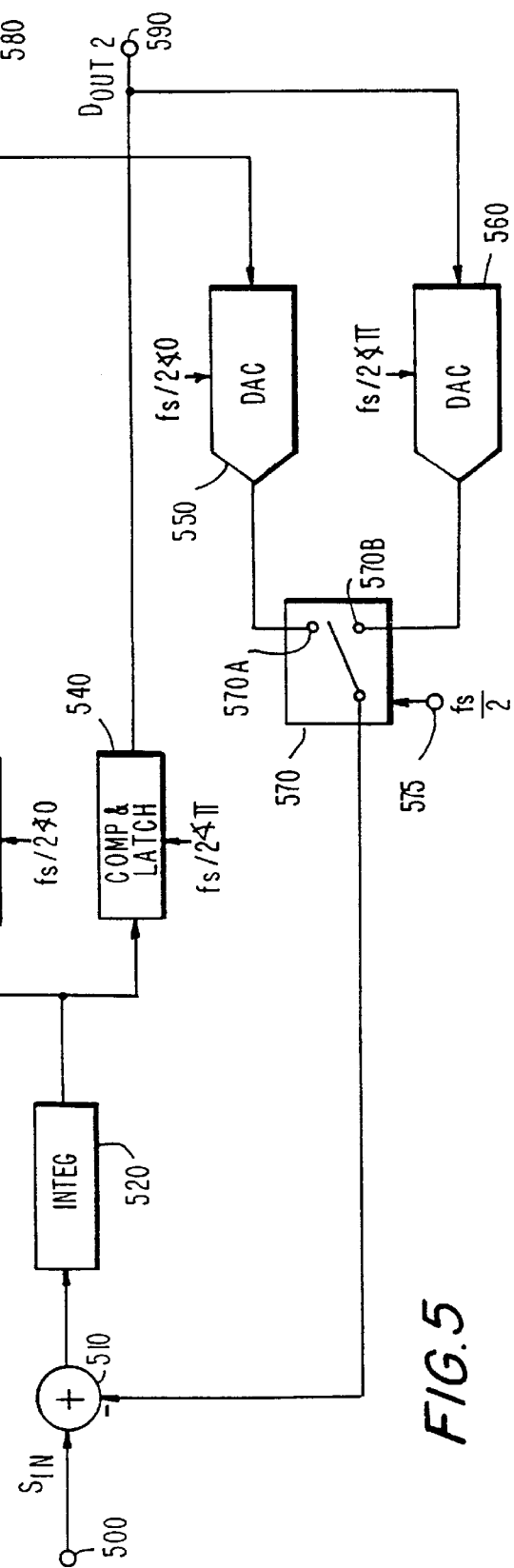

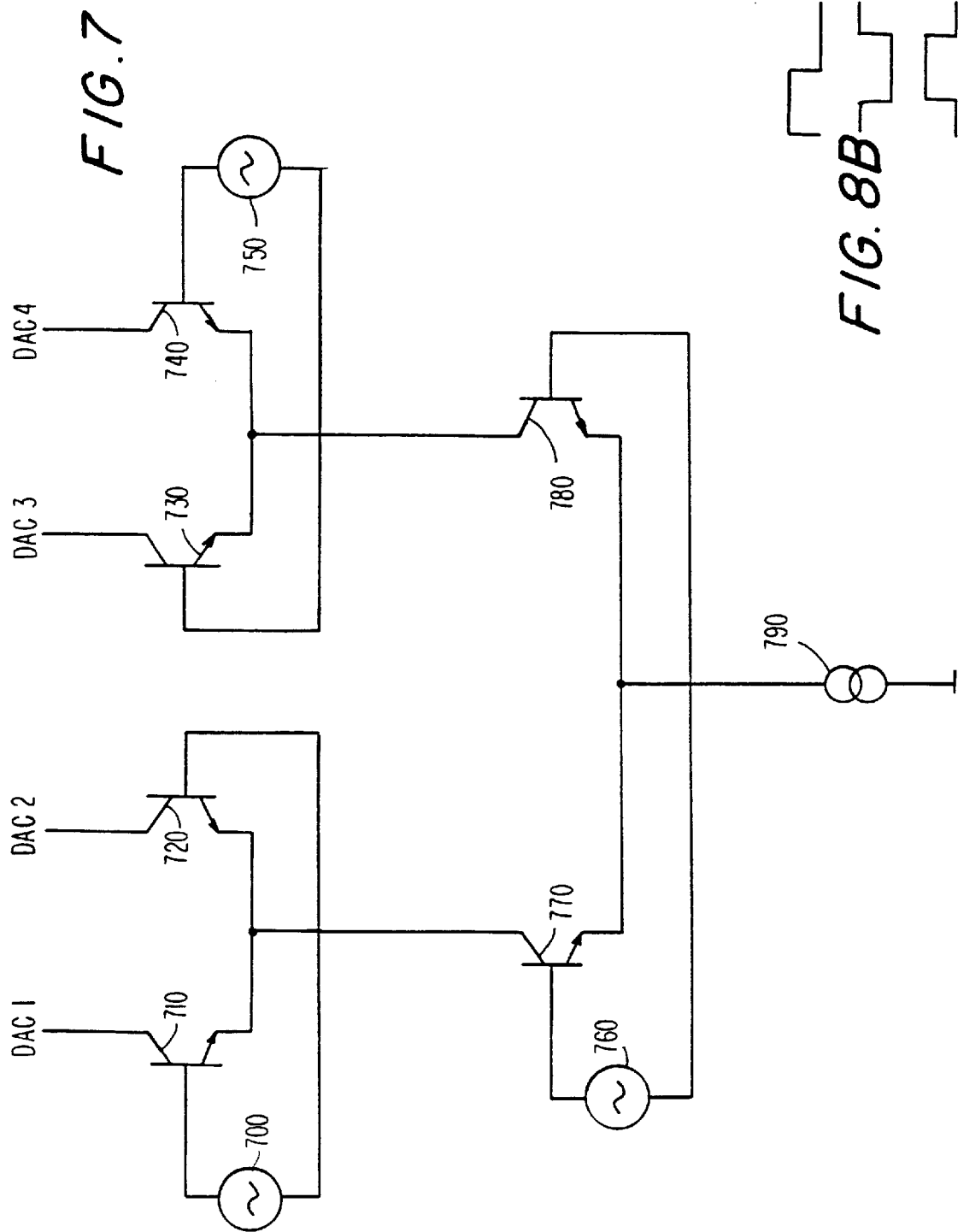

DELTA SIGMA-ANALOG-TO-DIGITAL CONVERTER

This is a continuation of copending International Application PCT/US98/00311 having an international filing date of Jan. 9, 1998.

BACKGROUND OF THE INVENTION

The present invention relates to analog to digital conversion, and, more particularly, is directed to a delta sigma type of analog to digital converter.

Delta sigma converters, also referred to as sigma delta modulators, convert a signal amplitude into digital data. An input signal at a given frequency $f_0$ is oversampled, that is, sampled at a rate $f_s$ much higher than the Nyquist rate, $f_s >> 2f_0$. When the delta sigma converter employs one-bit quantization, the output signal comprises a one-bit data pulse stream having a time average amplitude proportional to the amplitude of the input signal.

Quantization of the input signal introduces errors, that is, noise, into the output signal. A major advantage of delta sigma converters is their ability to shape the quantization noise spectrum, specifically, to move the noise from low frequencies into high frequencies. The output data is then low pass filtered to remove the noise.

A single bit first order delta sigma converter is shown in FIG. 1 as including subtractor 20, integrator 30, analog-to-digital converter 40 comprising comparator 43 and latch 46, and digital to analog converter 50.

An input signal $S_{IN}$ having a maximum frequency $f_0$ is applied to an input terminal 10 which supplies the signal $S_{IN}$ to a subtractor 20. The subtractor 20 subtracts a feedback signal from the present input signal to produce a difference signal, and applies the difference signal to an integrator 30.

The integrator 30 functions to add the difference signal to the sum of previous difference signals so as to generate an integrated signal, and to supply the integrated signal to a comparator 43.

The comparator 43 is operative to coarsely quantize the integrated signal into one of two levels, and to supply the quantized signal to a latch 46. The latch 46 also receives a control signal at the sampling frequency $f_s$ from a clock generator (not shown) via input terminal 45, and is adapted to sample the quantized signal in response to the control signal and to supply the sampled value as an output $D_{OUT}$ to an output terminal 60 and to a digital to analog converter (DAC) 50. Alternatively, the comparator 43 finely quantizes the integrated signal to produce an output signal exhibiting more than two levels.

The DAC 50 receives the output signal $D_{OUT}$ and the control signal at the sampling frequency $f_s$, and functions to convert the value $D_{OUT}$ to one of two output signal levels, and to supply the result as the feedback signal to the subtractor 20. The feedback ensures that the average value of the quantized signal tracks the average input.

As explained in James C. Candy et al., *Oversampling Delta-Sigma Data Converters*, IEEE Press, 1992, pages 2–7, for a first order delta sigma modulator, the rms noise $n_0$ in the signal band $f_0$ is given by:

$$n_0^{1st\ order} = e_{rms}(\pi^2/3)^{1/2}(2f_0/f_s)^{3/2} \qquad (eq.\ 1)$$

where $e_{rms}$ is the rms quantization error. Doubling the sampling frequency of a first order delta sigma converter decreases the in-band noise by 9 dB, corresponding to an increase in resolution of 1.5 bits.

The architecture of a first order delta sigma converter is fairly simple. Relatively imprecise circuit components can be used due to the presence of the feedback loop.

A second order delta sigma converter is shown in FIG. 2 as comprising subtractors 110, 130, integrators 120, 140, comparator 153, latch 156 and DAC 160. The second order delta sigma converter is generally similar to the first order delta sigma converter, except that the feedback signal is supplied to an "outer" subtractor 110 where it is combined with the input signal, and then integrated, before being applied to an "inner" subtractor 130.

An inner path comprising subtractor 130, integrator 140, comparator 153, latch 156 and DAC 160 serves to stabilize the system, and to determine the high frequency properties of the system. An outer path including subtractor 110 and integrator 120 dominates in determining the low frequency properties of the system.

For a second order delta sigma modulator, the rms noise $n_0$ in the signal band $f_0$ is given by:

$$n_0^{2nd\ order} = e_{rms}(\pi^4/5)^{1/2}(2f_0/f_s)^{5/2} \qquad (eq.\ 2)$$

Doubling the sampling frequency of a second order delta sigma converter decreases the in-band noise by 15 db, corresponding to an increase in resolution of 2.5 bits.

Relative to the first order delta sigma converter, the second order delta sigma converter is seen to reduce the quantization noise, permitting improved resolution. However, the second order delta sigma converter is less stable and less tolerant of component imprecision.

Delta sigma converters are generally used only with low frequency input signals, typically voice signals, due to the need for a high sampling frequency, specifically, a sampling rate up to several orders of magnitude higher than the Nyquist rate. For input signals of medium frequencies, components operating at an appropriately high sampling frequency are expensive. For input signals of high frequencies, components operating at an appropriately high sampling frequency are unavailable.

To achieve an effective sampling frequency of $f_s$ using components operating at a lower sampling frequency, it has been proposed to interleave two separate delta sigma converters each operating at $f_s/2$, with the clock signals for the delta sigma converters being offset. Unfortunately, the oversampling ratio $f_s/f_0$ for each of these delta sigma converters is reduced by half, so the in-band noise for each of the delta sigma converters in the interleaved structure is increased by 9 dB relative to a single delta sigma converter operating at $f_s$. Additionally, due to the noise from each delta sigma converter adding in quadrature, if uncorrelated, the in-band noise increases by an additional 3 dB. Overall, the noise increases by 12 dB for this scheme of interleaved delta sigma converters, corresponding to a reduction in resolution of 2 bits, relative to a single conventional delta sigma converter. Therefore, this proposed scheme is not effective.

Further, as known for example from EP734125 in the name of LeCroy Corporation, delta sigma converters are described below with reference to the figures, for the purpose of background information enabling the skilled man to put the technology into practice.

While that arrangement has many advantages as discussed in more detail throughout the description, various additional improvements are envisaged. In particular it is desired to reduce quantization noise and improve the signal to noise ratio yet further. Furthermore, the analog-to-digital converters in known arrangements such as those discussed above are typically of the "low-pass" type; that is, the circuit only responds to input signals containing frequencies below a certain cut-off frequency FC. Above this frequency the amplitude response to the circuit reduced in the digital representation of the input signal becomes inaccurate.

SUMMARY OF THE INVENTION

According to the present invention, an analog input signal is converted to at least two digital output signals as follows. An analog feedback signal is subtracted from the analog input signal to produce a difference signal. The difference signal, then, is integrated to produce an integrated signal which is quantized to produce the digital output signals in response to respective control signals each having a predetermined frequency and being offset in phase from each other. Finally, the digital output signals are converted into the analog feedback signal.

In accordance with another aspect of the present invention, there is provided a digital sampling oscilloscope comprising an analog to digital converter for converting an analog input signal to at least two digital output signals. In the analog to digital converter, an analog feedback signal is subtracted from the analog input signal to produce a difference signal which is integrated to produce an integrated signal. The integrated signal is quantized to produce the digital output signals in response to respective control signals each having a predetermined frequency and being offset in phase from each other. The digital output signals are then converted into the analog feedback signal.

The digital sampling oscilloscope further comprises a memory for storing the digital output signals, a processor for combining the stored digital output signals to produce a display signal, and a display for displaying the display signal.

BRIEF DESCRIPTION OF THE DRAWINGS

The above-mentioned as well as additional features and advantages of the present invention will become readily apparent from the following detailed description thereof which is to be read in conjunction with the accompanying drawings, in which:

FIG. 3 is a block diagram of an alternative delta sigma converter;

FIGS. 4A–4C are timing charts showing the relationship of the sampling frequencies used in the delta sigma converter of FIG. 3;

FIG. 5 is a block diagram of another delta sigma converter;

FIG. 7 is a diagram of a portion of a further delta sigma converter;

FIGS. 8A–8C are timing charts referred to in explaining the operation of the delta sigma converter shown in FIG. 7.

DETAILED DESCRIPTION OF THE PREFERRED EMBODIMENTS

Figures 1, 2:
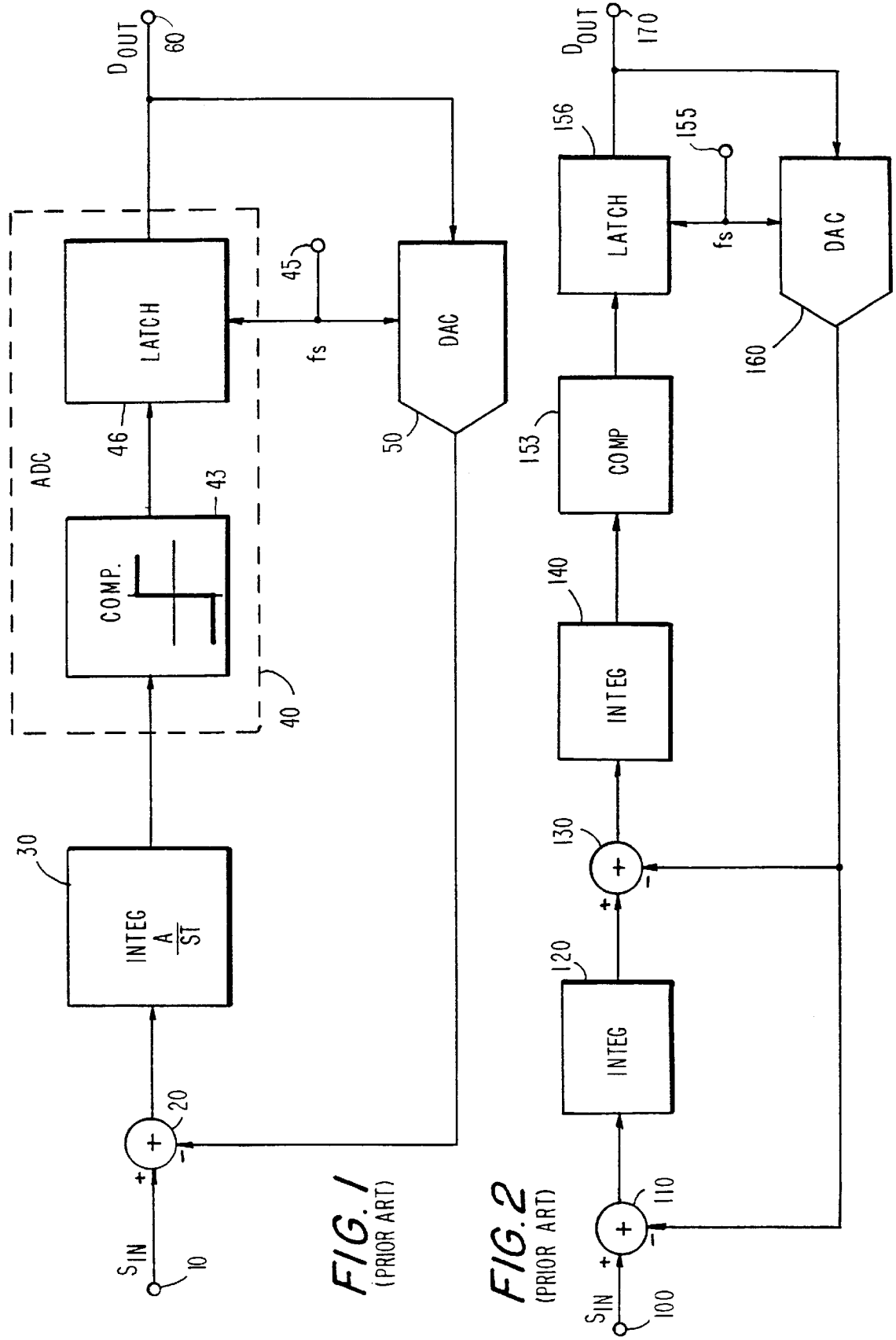
FIG. 1 is a block diagram of a first order delta sigma converter.
FIG. 2 is a block diagram of a second order delta sigma converter.

The quantizer of a conventional delta sigma converter, such as a comparator followed by a latch, is replaced with N quantizers, each operating at a reduced frequency $f_s/N$ and phase offset from each other by $2\pi/N$ radians. The quantized outputs are assembled in a digital to analog converter (DAC) in accordance with a control signal at a frequency $f_s$ to produce the feedback signal applied to the subtractor of the delta sigma converter. The delta sigma converter is discussed in relation to FIGS. 3 to 9 below.

A delta sigma converter can use components operating at a lower frequency than the sampling frequency $f_s$ without loss of dynamic range relative to a conventional delta sigma converter.

Advantages of a delta sigma converter relative to a flash ADC include fewer components, and consequently lower cost, reduced power requirements and greater reliability, that is, lower output error probability. For example, an eight bit flash ADC requires 255 comparators to produce 255 levels which are converted into eight bits by an encoder having substantial amounts of logic and latches.

Referring now to the drawings, and in particular to FIG. 3, there is illustrated an embodiment of a delta sigma converter. The apparatus illustrated in FIG. 3 comprises subtractor 310, integrator 320, sampling comparators 330, 340, switch 350 and DAC 360.

An input signal $S_{IN}$ is applied to an input terminal 300 which supplies the signal $S_{IN}$ to subtractor 310. The subtractor 310 functions to subtract a feedback signal from the current input signal to produce a difference signal, and applies the difference signal to an integrator 320. The integrator 320 functions to add the difference signal to the sum of previous difference signals so as to generate an integrated signal, and to supply the integrated signal to sampling comparators 330, 340.

The sampling comparators 330, 340 are each operative to coarsely quantize the integrated signal into one of two levels, to sample the quantized signal in response to the control signal at a sampling frequency of $f_s/2$ and to supply the respective sampled values as outputs $D_{OUT1}$, $D_{OUT2}$ to output terminals 370, 380, respectively, and to switch 350.

The sampling clock signals supplied to the comparators 330, 340 are interleaved in time. As shown in FIGS. 4A–4C, the sampling clock signal supplied to comparator 330 represents the odd pulses of the sampling clock signal $f_s$, while the sampling clock signal supplied to comparator 340 represents the even pulses of the sampling clock signal $f_s$. Alternatively, the sampling clock signal supplied to comparator 330 may be delayed by 180° to produce the sampling clock signal supplied to comparator 340.

The switch 350 receives the output signals $D_{OUT1}$, $D_{OUT2}$, each sampled at a rate of $f_s/2$ and also receives a control signal at the frequency $f_s/2$ from an input terminal 355, and is adapted to alternately select the quantized values $D_{OUT1}$, $D_{OUT2}$ at twice the rate of the control signal. For example, the control signal may be inverted, with one terminal providing a positive pulse of the non-inverted signal and another terminal providing a positive pulse of the inverted signal. The output of switch 350 thus is a signal at the desired sampling frequency $f_s$, although each of the sampling comparators 330, 340 operates at a rate of $f_s/2$.

The DAC 360 receives the switched outputs $D_{OUT1}$, $D_{OUT2}$ and the control signal at the sampling frequency $f_s$, and functions to convert the values $D_{OUT1}$, $D_{OUT2}$ to one of two output signal levels, and to supply the result as the feedback signal to the subtractor 310.

FIG. 5 illustrates another embodiment of the delta sigma converter. The apparatus illustrated in FIG. 5 comprises subtractor 510, integrator 520, sampling comparators 530, 540, DACs 550, 560 and switch 570.

The delta sigma converter of FIG. 5 operates in generally the same manner as the delta sigma converter of FIG. 3, except that the quantized outputs $D_{OUT1}$, $D_{OUT2}$ are supplied to DACs 550, 560, respectively, instead of to a switch. The DACs operate at the same frequency as the comparators, and are phase offset in the same manner. The outputs of the DACs 550, 560 are supplied to inputs 570A, 570B, respectively, of switch 570. A control signal at frequency $f_s/2$ is also supplied to the switch 570 from a clock signal generator (not shown) via input terminal 575. The switch 570 is operative to alternately select the outputs of the DACs 550, 560 to produce the feedback signal applied to subtractor 510.

In its general description, the delta sigma converter comprises N comparators, each operating at a frequency of $f_s/N$, and a switch having N inputs selected in turn at a rate of $f_s$. A delta sigma converter may also comprise N DACs, each operating at a frequency of $f_s/N$. The clock signals applied to the comparators and DACs are offset from each other by $2\pi/N$. For ease of illustration, FIGS. 3 and 5 show the case of N=2 for a first order delta sigma converter. For a higher order delta sigma converter, the feedback signal is supplied to another "outer" path including another subtractor and another integrator, as generally shown in FIG. 2.

If the comparators in a delta sigma converter are identical, then the outputs, when assembled, provide a signal having a signal to noise ratio which is indistinguishable from a conventional delta sigma converter having components operating at the sampling frequency $f_s$. Assembly of the outputs $D_{OUT1}$, $D_{OUT2}$ may be done by, for example, storing these values in alternate locations of a memory, such as addresses n, n+2, n+4, ... for the outputs $D_{OUT1}$, and addresses n+1, n+3, n+5, ... for the outputs $D_{OUT2}$, and then sequentially reading out the memory.

If the comparators in a delta sigma converter are not identical, then the assembled outputs exhibit an error signal at the frequency $f_s/N$, which can readily be eliminated by bandpass filtering the composite signal. For example, when the assembled outputs are $D_{OUT1}^{(n)}$, $D_{OUT2}^{(n+1)}$, $D_{OUT1}^{(n+2)}$, $D_{OUT2}^{(n+3)}$, ..., the filtering may comprise averaging pairs of adjacent assembled outputs to produce filtered outputs $(D_{OUT1}^{(n)} + D_{OUT2}^{(n+1)})/2$, $(D_{OUT2}^{(n+1)} + D_{OUT1}^{(n+2)})/2$, $(D_{OUT1}^{(n+2)} + D_{OUT2}^{(n+3)})/2$, A delta sigma converter may operate to quantize the integrated signal to more than two levels by using, for example, a flash A/D converter, instead of a comparator. In this case, positioning of the quantization thresholds must be considered.

Assuming an input signal of frequency $f_0$=500 MHz, a sampling frequency $f_s$=10 GHz, and a latch which works properly only below 10 gigasamples per second, then a conventional delta sigma converter cannot be constructed. However, a delta sigma converter with two temporally interleaved latches is feasible. A delta sigma converter with four temporally interleaved latches is also feasible, and exhibits an increase in resolution of 2.5 bits for a second order system. If eight temporally interleaved latches are used, then an increase in resolution of 5 bits is obtained for a second order system.

Thus, a delta sigma converter permits a tradeoff between number of components and resolution, with only a small increase in complexity relative to a conventional delta sigma converter. The conventional tradeoff between sampling frequency and resolution is available in a delta sigma converter.

In some applications it is advantageous to demultiplex the digital output of a delta sigma converter for subsequent processing. A delta sigma converter is seen to inherently produce demultiplexed digital outputs.

Figure 6:
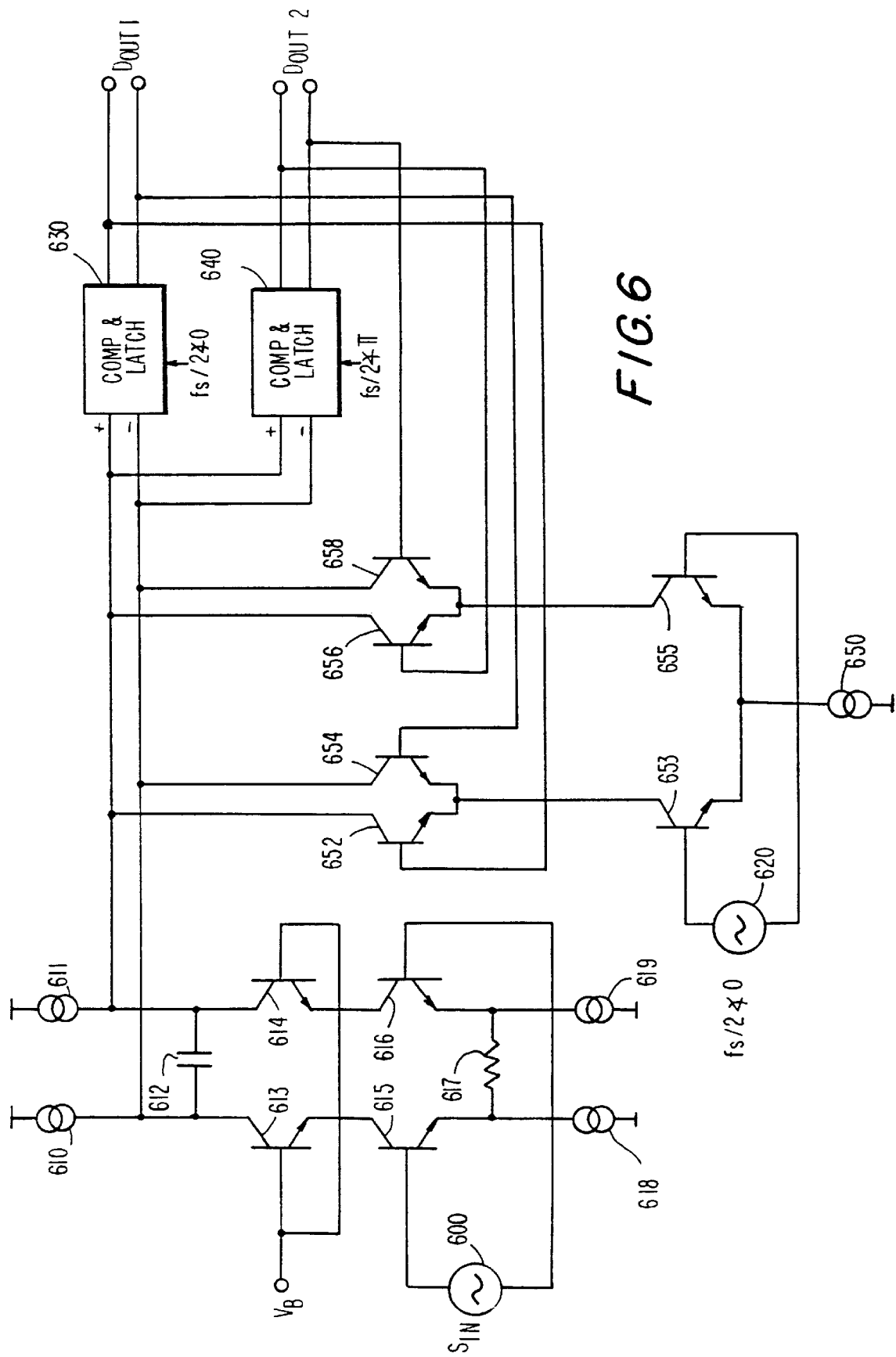
FIG. 6 is a diagram of yet another delta sigma converter.

FIG. 6 shows another embodiment of a delta sigma converter similar to the delta sigma converter of FIG. 5. In the delta sigma converter of FIG. 6, the DAC reference current is switched, whereas in the delta sigma converter of FIG. 5, the DAC outputs are switched. As explained below, the delta sigma converter of FIG. 6 requires a clock operating at only $f_s/2$ to achieve an effective switching rate of $f_s$.

The delta sigma converter of FIG. 6 comprises current sources 610, 611, 618, 619, 650, voltage source 620, capacitor 612, resistor 617, transistors 613, 614, 615, 616, 652, 653, 654, 655, 656, 658, and sampling comparators 630, 640.

Transistors 613, 614, 615, 616 form a cascade differential amplifier. The emitters of transistors 615, 616 are respectively connected to each of the terminals of resistor 617. The collectors of transistors 613, 614 are respectively connected to each of the terminals of capacitor 612, and the bases of transistors 613, 614 are connected in common to a bias voltage $V_B$.

The terminals of capacitor 612 are also connected to the collectors of transistors 652, 654, 656, 658. Transistors 652, 654 form a DAC and transistors 656, 658 form another DAC. The emitters of transistors 652, 654 are connected in common to the collector of transistor 653. The emitters of transistors 656, 658 are connected in common to the collector of transistor 655.

Transistors 653, 655 are adapted to switch the reference current of the DACs formed by transistors 652, 654 and 656, 658.

The terminals of capacitor 612 are additionally connected to positive and negative inputs of each of sampling comparators 630, 640. Comparator 630 is coupled to the DAC formed by transistors 652, 654, and comparator 640 is coupled to the DAC formed by transistors 656, 658.

The circuit consisting of transistors 613, 614, 615, 616, resistor 617 and current sources 610, 611, 618, 619 is a differential transconductance circuit which functions to convert the input signal $S_{IN}$ into a differential current which is output from the collectors of transistors 613 and 614. A feedback current signal from the DACS, phased such that the feedback is negative, is also applied to the capacitor 612.

Capacitor 612 is adapted to sum the negative feedback current signal with the input current signal and a signal already present on the capacitor, and to supply the result as an integrated signal to comparators 630, 640.

The comparators 630, 640 function to quantize the integrated signal, that is, to compare the integrated signal with a predetermined threshold, to produce one value if the signal is at least equal to the threshold and another value if the signal is less than the threshold, and to hold the resulting value until the next sampling instant.

Transistors 653, 655 act to switch, that is, to enable or disable the DAC transistor pairs 652, 654 and 656, 658.

When transistor 653 is enabled by the sampling clock signal 620, current from current source 650 flows to the common emitters of transistors 652, 654. If $D_{OUT1}$ is a logic "0", then all current form source 650 flows through the collector of transistor 654. If $D_{OUT1}$ is a logic "1", then all current from source 650 flows through the collector of transistor 652. Thus, the feedback signal corresponds to the value $D_{OUT1}$ from comparator 630.

Provision of phasing so that the feedback signal is negative is accomplished as follows: Let it be assumed that the input to the comparators is such that the "+" input is more positive than the "−" input. This is transferred to the latch as a logical "1", so transistor 652 is "on" and transistor 654 is "off", and the current in the collector of transistor 652 acts to reduce the potential at the comparator "+" input, thus forming a negative feedback connection.

Similarly, when transistor 655 is enabled by the sampling clock signal 620, current from current source 650 flows to the common emitters of transistors 656, 658. If $D_{OUT1}$ is a logic "0", then all current flows through the collector of transistor 658. If $D_{OUT2}$ is a logic "1", then all current flows through the collector of transistor 656. Thus, the feedback signal corresponds to the value $D_{OUT2}$ from comparator 640.

The sampling clock signal 620 may be thought of as having a period including a positive edge and a negative edge. While the rate of the sampling clock signal is determined by the positive going edge in each period, the effective switching rate of the DACs is determined by the positive and negative edges in a period, since the positive edge enables transistor 653 while the negative edge enables transistor 655. Thus, a clock signal having a rate of $f_s/2$ provides an effective switching rate of $f_s$ in the configuration of FIG. 6.

The configuration of FIG. 6 may readily be extended to four comparators each operating at a rate of $f_s/4$ and four DAC transistor pairs respectively connected between the outputs of the comparators and a capacitor in a cascade configuration. FIG. 7 shows the corresponding extension of the circuit portion which switches the reference current for the DAC transistor pairs so that only one of the comparator outputs is fed back to the summing capacitor.

FIG. 7 comprises clock signal sources 700, 750, 760, transistors 710, 720, 730, 740, 770, 780, and current source 790. The collectors of transistors 710, 720, 730, 740 are respectively connected to the common emitters of the transistors in the transistor pairs forming the four DACs.

Clock signal 760 has a frequency of $f_s/4$ During the "positive pulse" portion of each period having a duration of $2\tau$, transistor 770 is enabled and so current from current source 790 flows to the common emitters of transistors 710, 720. Clock signal 700 has a frequency of $f_s/2$. During the "positive pulse" portion of each period having a duration of $\tau$, transistor 710 is enabled so that a first comparator output is fed back through DAC1 . During the "negative pulse" portion of each period, also having a duration of $\tau$, transistor 720 is enabled so that a second comparator output is fed back through DAC2.

During the "negative pulse" portion of each period of clock signal 760, also having a duration of $2\tau$, transistor 780 is enabled and so current form current source 790 flows to the common emitters of transistors 730, 740. Clock signal 750 also has a frequency of $f_s/2$. During the "positive pulse" portion of each period, transistor 730 is enabled so that a third comparator output is fed back through DAC3, and during the "negative pulse" portion of each period, transistor 740 is enabled so that a fourth comparator output is fed back through DAC4.

Alternatively, the clock signal 760 may have a frequency of $f_s/4$ and a phase of 0°, the clock signal 700 may have a frequency of $f_s/4$ and a phase of 270°, and the clock signal 750 may have a frequency of $f_s/4$ and a phase of 90°, as shown in FIGS. 8A–8c. Thus, to achieve an effective feedback signal rate of $f_s$, a maximum clock signal rate of only $f_s/4$ is required. Generally, to achieve an effective feedback signal rate of $f_s$ a maximum clock signal rate of only $f_s/N$ is required, where n is the number of comparators and corresponding DAC transistor pairs.

Applications for delta sigma converters including the type discussed below according to the invention include digital sampling oscilloscopes, modular test and instrumentation systems, applications where portability or battery powered operation are important, and generally any situation where conversion of an analog signal to a digital signal is required.

Figure 9:
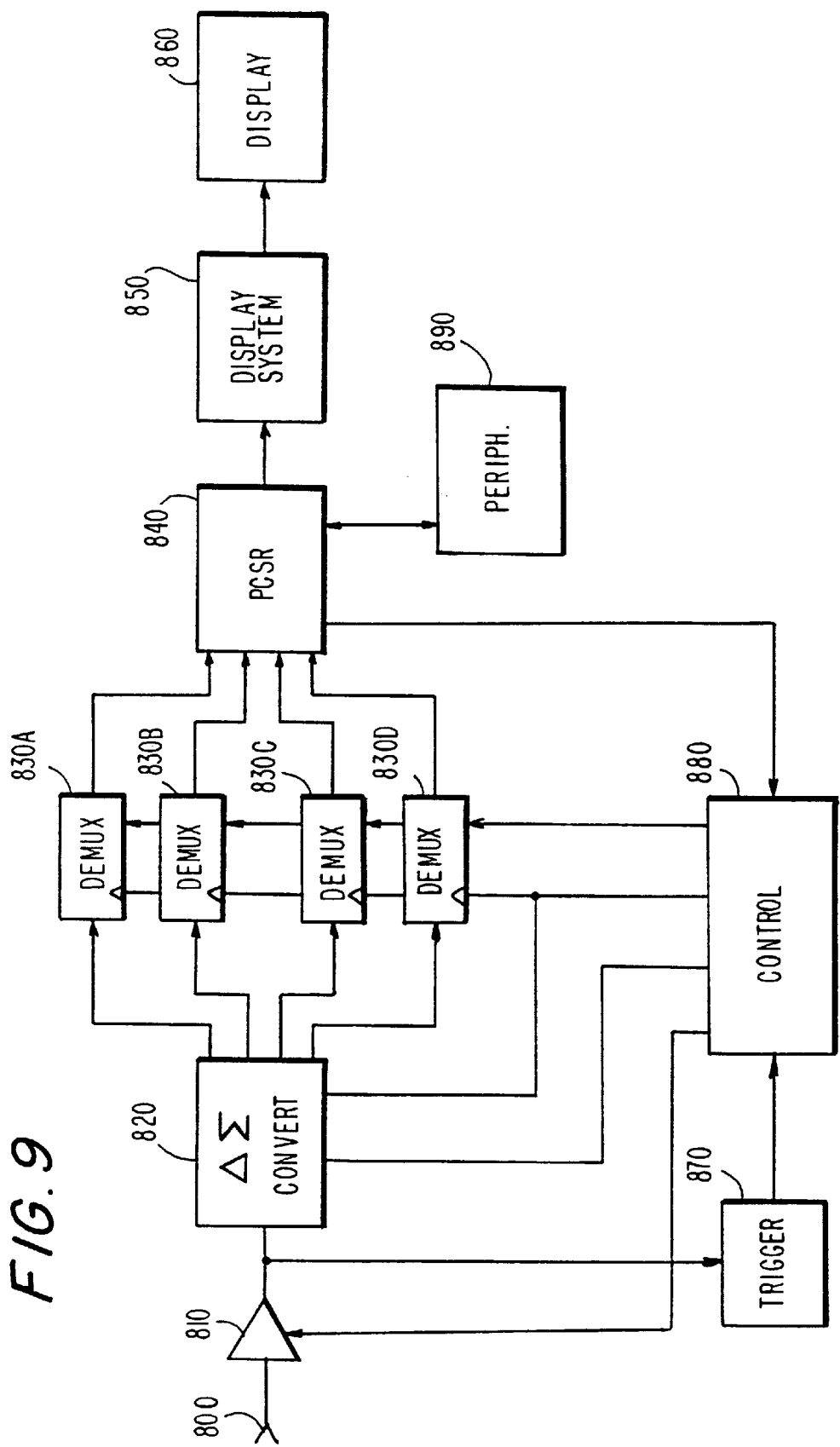
FIG. 9 shows a digital sampling oscilloscope incorporating a delta sigma converter.

FIG. 9 shows a digital sampling oscilloscope incorporating a delta sigma converter.

An input signal is supplied to terminal 800 which applies the input signal to signal conditioner 810 that functions to amplify, offset and otherwise suitably condition the input signal in a conventional manner, and to supply the conditioned signal to delta sigma converter 820 and to trigger processor 870.

Controller 880 is adapted to generate clock signals suitable for the timebase of the input and output signals, and to supply these clock signals to delta sigma converter 820 and demultiplexers 830A–D. Controller 880 also generates write and read control signals for memories included in the demultiplexers 830A–D.

Delta sigma converter 820 functions to convert the conditioned input signal into digital data pulse streams having a combined time average amplitude proportional to the amplitude of the input signal, and to supply the digital data to demultiplexers 830A–D.

Demultiplexers 830A–D respectively include a memory for storing the digital data supplied thereto in accordance with clock pulses and write control signals supplied thereto from controller 880. The demultiplexers are needed only when the data rate from the converter is too fast for the memories to accommodate directly.

Trigger processor 870 is adapted to detect a trigger indication in the conditioned input signal, and to supply a halt signal to controller 880 upon detection of the trigger indication. Controller 880 serves to respond to the halt signal from trigger processor 870 by generating a control signal to delta sigma converter 820 to halt signal conversion, and generating a read control signal to demultiplexers 830A–D to transfer their contents to processor 840.

Additionally, when data is transferred from demultiplexers 830A–D to processor 840, the data may be pre-processed by, for example, filtering as described above, or by conditioning to a form suitable for display. The filtering may be performed by processor 840 or by a dedicated digital signal processor.

Processor 840 is adapted to combine the signals read out from the memories in demultiplexers 830A–D, as filtered or conditioned, to form a display signal and to supply the display signal to display system 850 which stores and suitably formats the display signal for display on display 860.

Figure 13:
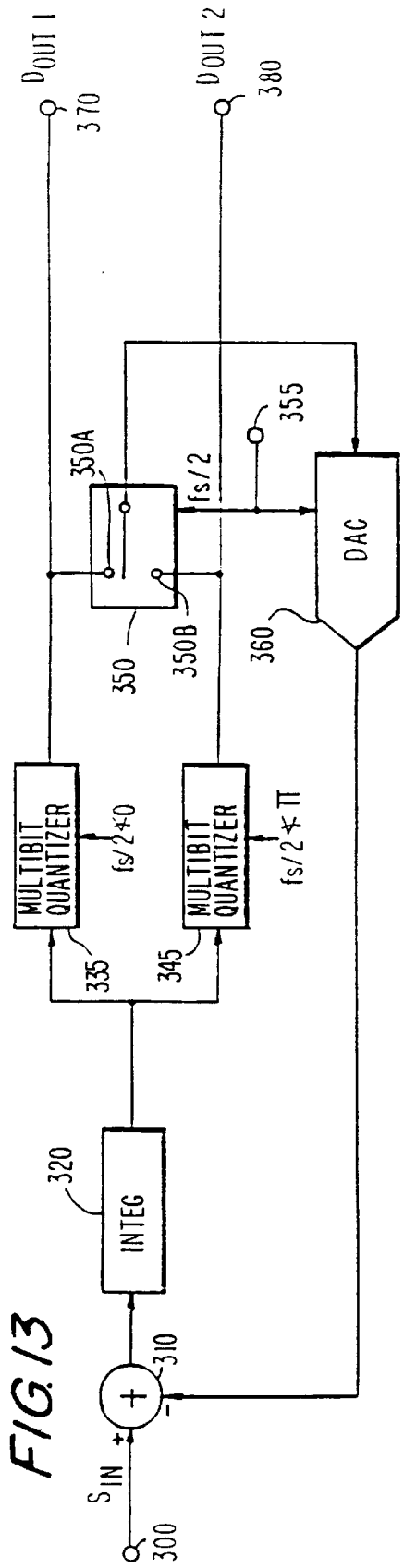
FIG. 13 shows a further delta sigma converter according to the present invention.

In accordance with the present invention, each of the quantizing elements (e.g. 330, 340; 530, 540) rather than comprising a single comparator and latch may be replaced by multiple comparators 335, 345 with associated latches as shown in FIG. 13. The reference inputs to these comparator arrays should be suitably matched in a known manner to the output range of the preceding integration filters (320; 520). Throughout the specific description like reference numerals refer to like components.

The feedback signals (350A, 350B; 580, 590) to the DAC elements (360; 550, 560) consist of the most significant bit (or equivalently the decision made by the central comparator) of the resulting comparator array. This signal is identical to that which was obtained from the structures containing single comparator quantizing elements and hence the action of the feedback loop is entirely unaffected by the change. The outputs (370, 380; 580, 590) are now however multibit rather than single bit. These multibit words require a small amount of digital signal processing, before the normal decimation filters well known from conventional arrangements. The requisite additional processing can be performed in a number of different ways as will be clear to those skilled in the art.

The advantage of using such quantizing elements is that for N comparators in a quantizing element, the quantization noise is reduced by $20*N*\log_{10}(2)$ decibels. This reduction in quantization noise improves the signal to noise ratio of the complete converter by the same amount. The converters are illustrated with first order loops, although extensions to higher orders will be evident and are discussed in detail in relation to the known arrangements above. That discussion can be applied in relation to the present invention by those skilled in the art. The multibit quantizers described here may be used in time-interleaved architectures of any order.

Figure 10:
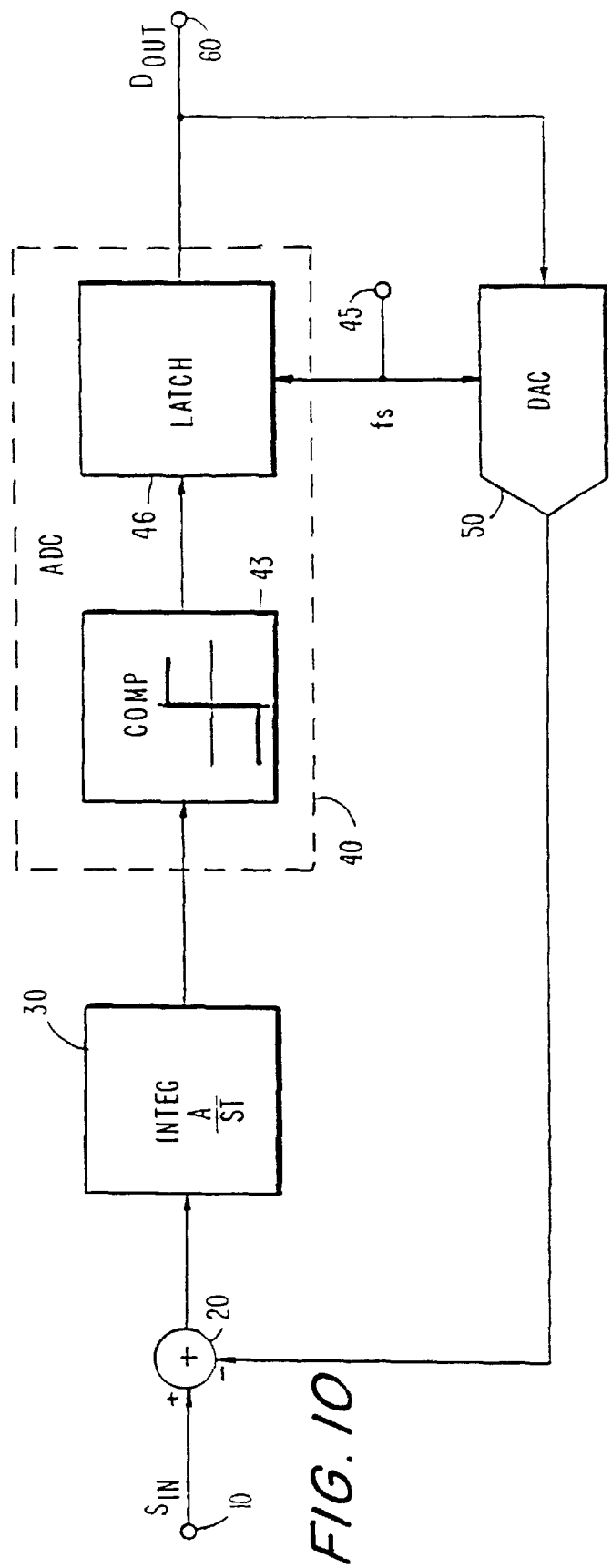
FIG. 10 shows a delta sigma converter.

The analog-to-digital converter (ADC) discussed above in relation to known arrangements is typically of the "low-pass" type: that is, the circuit only responds to input signals containing frequencies below a certain "cut-off" frequency $f_c$. Above this frequency, the amplitude response of the circuit is reduced and the digital representation of the input signal becomes inaccurate. In some circumstances, it is desirable to have an ADC which has a "bandpass" response: that is, it only responds to input signals containing frequencies that lie between a lower cut-off frequency $f_1$ and an upper cut-off frequency $f_2$. This kind of ADC has applications in systems where the signal of interest has been modulated onto a carrier, such as direct conversion digital radios. This is achieved according to the basic principle of another aspect of the invention by introducing a resonator 25 in place of the integrator shown in FIG. 1, as shown in schematic form in FIG. 10 in combination with other inventive aspects of the invention. FIG. 10 shows a simple first order delta sigma converter having a bandpass response. More than one resonator 25 can be used in higher order delta sigma converters with advantages in terms of improvement in the system signal to noise ratio as described hereinabove.

Figure 11:
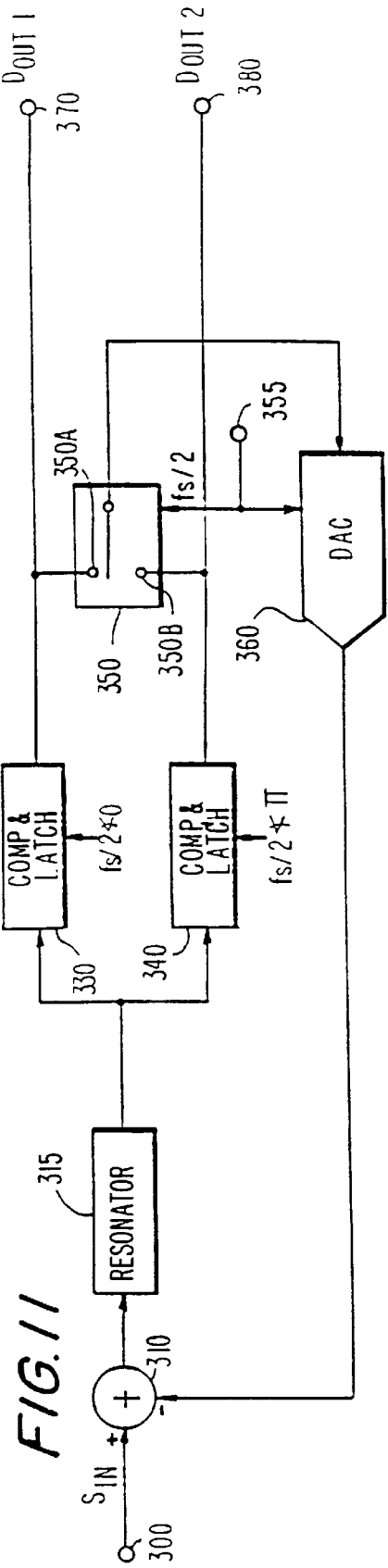
FIG. 11 shows a delta sigma converter according to one aspect of the present invention.
Figure 12:
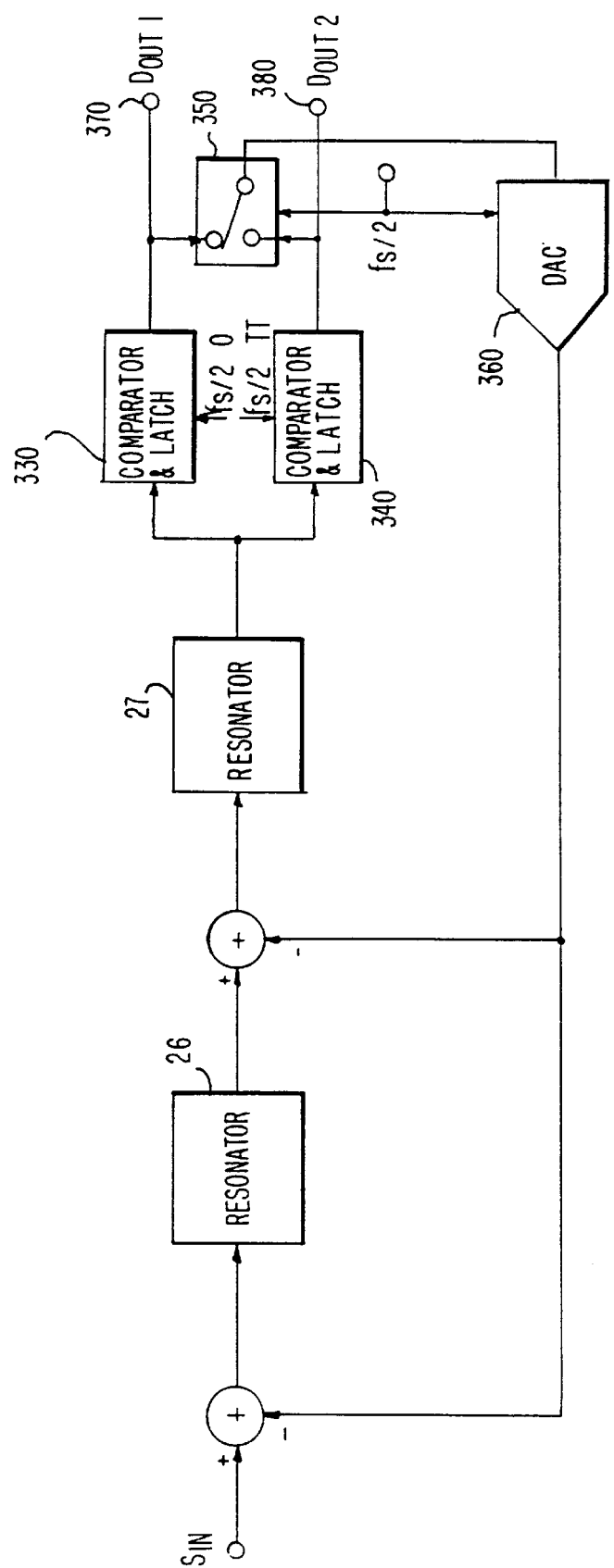
FIG. 12 shows a delta sigma converter according to the present invention.

The invention thus comprises a time-interleaved architecture for a delta sigma ADC having a bandpass characteristic. A simple first order time-interleaved delta sigma ADC with one resonator 315 and two quantizers 330, 340 is shown in FIG. 11. The resonator 25 is configured in a known manner to set a lower cut-off frequency $f_1$ and an upper cut-off frequency $f_2$ thereby defining the bandpass characteristic of the converter. This structure gives a bandpass characteristic with all the advantages described above for a time-interleaved low pass ADC, namely, low complexity, lower operating frequency for the quantizers with improved signal to noise ratio, and low manufacturing cost. A second order ADC with two quantizers and resonators 26, 27 is shown in FIG. 12. The advantage of a second order structure over a first order structure is explained in the discussion above, but, principally, for a given ratio of sampling frequency $F_s$, to maximum signal frequency $F_o$, the second order architecture produces better signal-to-noise ratio than a first order architecture.

Figure 14:
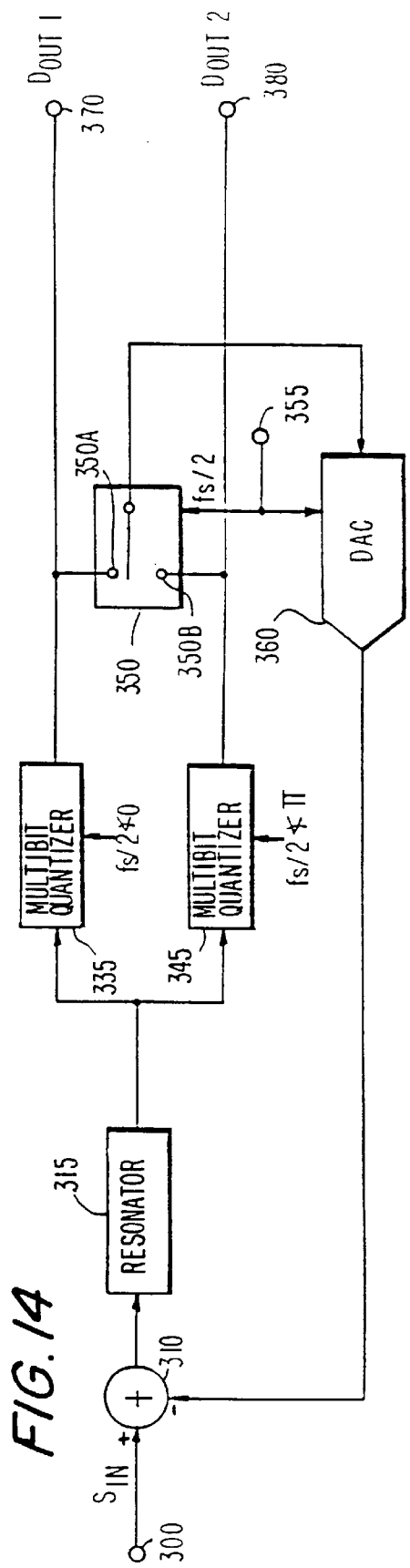
FIG. 14 shows a delta sigma converter according to the present invention comprising a combination of the arrangements shown in FIGS. 10–13.

A final converter architecture according to the invention comprises a combination of the arrangements described in relation to FIGS. 10–13. In the bandpass structures described with reference to FIGS. 10 to 12 the quantizing elements 330, 340 are single comparators. As shown in FIG. 14, these can be replaced by the comparator arrays 335, 345 as described in relation to FIG. 13, with the same effect as that obtained for the low-pass time-interleaved sigma delta architectures: namely an improvement in overall signal-to-noise ratio equal to $20*N*\log_{10}(2)$ decibels. Once again time-interleaved bandpass converters of any order may be used.

Having described specific preferred embodiments of the invention with reference to the accompanying drawings, it is to be understood that the invention is not limited to those precise embodiments, and that various changes and modifications may be effected therein by those skilled in the art without departing from the scope or the spirit of the invention as defined in the appended claims.

What is claimed is:

1. An analog to digital converter for converting an analog input signal to at least two digital output signals, comprising:

subtracting means for subtracting an analog feedback signal from said analog input signal to produce a difference signal;

resonator means operative to receive said difference signal to produce a resonator output signal;

quantizing means for quantizing the resonator output signal to produce the digital output signals in response to respective control signals each having a predetermined frequency and being offset in phase from each other; and means for converting the digital output signals into said analog feedback signal.

2. The analog to digital converter according to claim 1, wherein each of the digital output signals includes at least two bits, and wherein said means for converting converts a predetermined number of bits into said analog feedback signal.

3. The analog to digital converter according to claim 1, wherein said analog feedback signal has at least one frequency, and said predetermined frequency is said one frequency divided by the number of digital output signals.

4. The analog to digital converter according to claim 1, wherein said means for converting comprises switch means for alternately selecting between the digital output signals to produce a composite output signal, and conversion means for converting said composite output signal to said analog feedback signal.

5. The analog to digital converter according to claim 1, wherein said means for converting comprises at least two conversion means for respectively converting the digital output signals to respective converted signals, and switch means for alternately selecting between the converted signals to produce said analog feedback signal.

6. The analog to digital converter according to claim 1, wherein said means for converting comprises at least two conversion means for respectively converting the digital output signals to respective converted signals, switch means for selectively enabling the conversion means, and means for combining the converted signals to form said analog feedback signal.

7. The analog to digital converter according to claim 1, further comprising means for producing a clock signal having said predetermined frequency.

8. The analog to digital converter according to claim 1, wherein said quantizing means comprises comparison means for comparing said resonator output signal with at least one predetermined threshold to produce a comparison result, said comparison means including means for providing each of the digital output signals in accordance with said comparison result.

9. The analog to digital converter according to claim 1, wherein said quantizing means comprises latch means for respectively storing the digital output signals in response to the control signals.

10. The analog to digital converter according to claim 1, wherein said means for converting are responsive to said predetermined frequency.

11. A method for converting an analog input signal to at least two digital output signals, comprising the steps of:

subtracting an analog feedback signal from the analog input signal to produce a difference signal;

receiving the difference signal to produce a resonator output signal;

quantizing said resonator output signal to produce the digital output signals in response to respective control signals each having a predetermined frequency and being offset in phase from each other, and converting the digital output signals into said analog feedback signal.

12. The method according to claim 11, wherein said analog feedback signal has at least one frequency, and said predetermined frequency is said one frequency divided by the number of digital output signals.

13. The method according to claim 11, wherein said step of converting comprises selecting between the digital output signals to produce a composite output signal, and converting said composite output signal to said analog feedback signal.

14. The method according to claim 11, wherein said step of converting comprises respectively converting the digital output signals to respective converted signals, and selecting between the converted signals to produce said analog feedback signal.

15. The method according to claim 11, further comprising producing a clock signal having said predetermined frequency.

16. The method according to claim 11, wherein said step of quantizing comprises comparing said resonator output signal with at least one predetermined threshold and providing the digital output signals in accordance with said step of comparing.

17. The method according to claim 11, wherein said step of quantizing comprises respectively storing the digital output signals in response to the control signals.

18. A digital sampling oscilloscope, comprising:

an analog to digital converter for converting an analog input signal to at least two digital output signals, said analog to digital converter comprising:

subtracting means for subtracting an analog feedback signal from said analog input signal to produce a difference signal;

resonator means operative to receive said difference signal to produce a resonator output signal;

quantizing means for quantizing said resonator output signal to produce the digital output signals in response to respective control signals each having a predetermined frequency and being offset in phase from each other; and means for converting the digital output signals into said analog feedback signal;

memory means for storing the digital output signals;

processor means for combining the stored digital output signals to produce a display signal; and display means for displaying said display signal.

* * * * *